United States Patent [19]
Hayakawa et al.

[11] Patent Number: 5,766,996
[45] Date of Patent: Jun. 16, 1998

[54] METHOD OF MANUFACTURING A SEMICONDUCTOR DEVICE

[75] Inventors: Toshiyuki Hayakawa; Seiichi Aritome, both of Kanagawa-ken, Japan

[73] Assignee: Kabushiki Kaisha Toshiba, Kawasaki, Japan

[21] Appl. No.: 561,020

[22] Filed: Nov. 21, 1995

[30] Foreign Application Priority Data

Nov. 21, 1994 [JP] Japan .................. 6-286517

[51] Int. Cl.⁶ ......................................... H01L 21/336
[52] U.S. Cl. ..................... 438/257; 438/261; 438/265
[58] Field of Search ........................... 437/51, 52, 53, 437/49; 438/257, 258, 261, 265, 266

[56] References Cited

U.S. PATENT DOCUMENTS 4,635,347  1/1987  Lien et al. .......................... 437/43
5,447,877  9/1995  Sasaki .

Primary Examiner—Tuan H. Nguyen
Attorney, Agent, or Firm—Banner & Witcoff, Ltd

[57] ABSTRACT

A method of manufacturing a semiconductor device includes the steps of forming memory cell sections in a nonvolatile semiconductor memory device which has the memory cell sections and peripheral circuit transistor sections formed on a semiconductor substrate, coating a stacked region of the memory cell sections and a top surface of the peripheral circuit transistor sections with an oxidation-resistant layer, and forming an oxide layer over the surface of the semiconductor substrate by thermal oxidation. The peripheral circuit transistor gate oxide layer is suitably oxidized to have sufficient dielectric strength while preventing the interlayer insulating layer between the control gate edge and the floating gate edge of a memory cell from being oxidized more than necessary.

19 Claims, 23 Drawing Sheets

1

METHOD OF MANUFACTURING A SEMICONDUCTOR DEVICE

BACKGROUND OF THE INVENTION

1. Field of the Invention

The present invention relates to a method of manufacturing a nonvolatile semiconductor memory device having a two-layer structure comprised of a floating gate and a control gate.

2. Description of the Related Art

Conventionally, referring to FIG. 8, in manufacturing a nonvolatile semiconductor memory device equipped with MOS transistors of a two-layer gate structure having a floating gate and a control gate as memory cells, an after-oxide layer is formed by thermal oxidation after memory cell sections 200, 201 and peripheral circuit transistors 300, 301 have been formed.

Referring to FIG. 8, in nonvolatile semiconductor memory devices in which the peripheral circuit transistors 300, 301 are driven by high voltages in the range of 8V to 30V, for example, NAND type EEPROMs, the gate oxide layer 9 between the edge of a gate of peripheral circuit transistor 300 and a diffusion layer 2 needs a thickness of t1. The gate oxide layer 9 has a higher dielectric strength and can sufficiently prevent drain breakdown which may occur under the channel because it is impressed with a higher electric field than the gate oxide layer 4 between the edge of a floating gate 5 of memory cell section 200 and a diffusion layer 2.

Thus, the after-oxide layer 8 is formed by thermal oxidation over a sufficiently long time to build the dielectric strength of the gate oxide layer 9 at the edge of the gate of the peripheral circuit transistor 300.

However, a long period of oxidation in the manufacture of a non-volatile semiconductor device, such as a NAND type EEPROM, in which peripheral circuitry is driven by a high voltage will cause more oxide than necessary to form on the edge of the gate of a memory cell in, for example, memory cell section 200.

In particular, an interlayer dielectric layer between the edge of a control gate 13 and the edge of a floating gate 5, for example, an ONO layer 6, will have an oxide thickness of t2.

This causes the coupling ratio of a memory cell to be lowered degrading its characteristics. That is, there is a problem that the interlayer dielectric layer between the edge of the control gate 13 and the edge of the floating gate 5 of a memory cell, for example, the ONO layer 6, is made thicker than necessary, and hence the coupling ratio of the memory cell is lowered degrading the characteristics of the cell.

SUMMARY OF THE INVENTION

It is accordingly an object of the present invention to provide a method of manufacturing a semiconductor device which permits the gate oxide layer at the edge of a peripheral circuit transistor gate to be suitably formed so that it will have a sufficient dielectric strength without oxidizing the interlayer insulating layer between the control gate edge and the floating gate edge of a memory cell more than necessary.

To achieve this object, the present invention provides a method of manufacturing a nonvolatile semiconductor memory device with memory cell sections and peripheral circuit transistor sections formed on a semiconductor substrate. The method includes the steps of forming a first multilayered structure constituting the memory cell sections and a second multilayered structure constituting the peripheral circuit transistor sections, and then coating the entire surface of the first multilayered structure with an oxidation-resistant layer and forming the oxidation-resistant layer on the top of the second multilayered structure and forming an oxide layer over the surface by thermal oxidation, after the formation of the oxidation-resistant layer.

More specifically, the method includes the steps of forming a first insulating layer, a first conductive layer, and a second insulating layer in sequence on a surface region of the semiconductor substrate, and selectively removing the second- insulating layer, the first conductive layer and the first insulating layer on a non-memory cell area where memory cells are to be formed until the semiconductor substrate surface is exposed. Further, the method includes the steps of forming a third insulating layer on the semiconductor substrate surface in the non-memory cell area, forming a second conductive layer on the second insulating layer in the memory cell area and on the third insulating layer in the non-memory cell area, and selectively removing the second conductive layer, the second insulating layer, the first conductive layer, and the first insulating layer in a desired area in the memory cell area. The method also includes depositing an oxidation-resistant layer on the second conductive layer and the semiconductor substrate, selectively removing a portion of the oxidation-resistant layer, the second conductive layer and the third insulating layer in the non-memory cell area in sequence, and forming an oxide layer on the oxidation-resistant layer and the semiconductor substrate by thermal oxidation.

According to the semiconductor manufacturing method, since the oxidation-resistant layer is not formed on the peripheral circuit transistors, the gate oxide layer between the transistor gate edge and the diffusion layer is formed by thermal oxidation to a thickness having sufficient dielectric strength. Since the memory cells are coated with the oxidation-resistant layer, the oxidation of the ONO layer between the control gate edge and the floating gate edge is prevented, keeping the coupling ratio from lowering.

BRIEF DESCRIPTION OF THE DRAWINGS

The present invention will now be described in more detail with reference to preferred embodiments given only by way of example, and illustrated in the accompanying drawings in which.

DETAILED DESCRIPTION OF THE PREFERRED EMBODIMENTS

Hereinafter, the embodiments of the present invention will be described in detail with reference to the drawings.

FIG. 1(a) to FIG. 1(h) are sectional views of a NAND type EEPROM during the manufacturing steps of a semiconductor manufacturing method according to a first embodiment of the present invention. The present embodiment will be described in terms of a NAND type EEPROM by way of example.

Figure 1A:
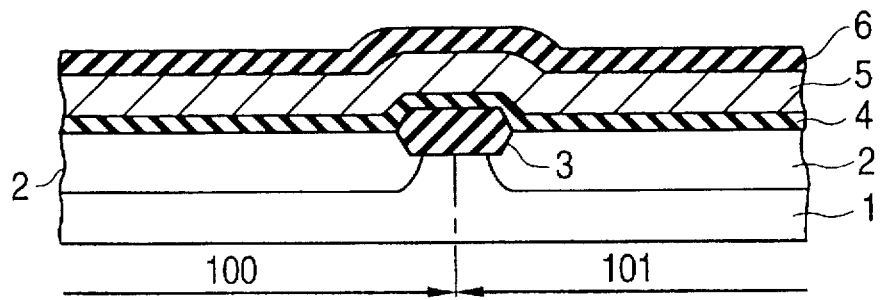
FIG. 1 (a)–1 (h) illustrates, in sectional form, a semiconductor device manufacturing method according to a first embodiment of the present invention.

First, in the step shown in Fig. 1(a), after a well region 2 is formed on a N type silicon substrate 1, selective oxidation is carried out using device isolation techniques, e.g. LOCOS (local oxidation of silicon), to form a silicon oxide layer of a thickness of 500 nm in the device isolation region 3.

Figure 9A:
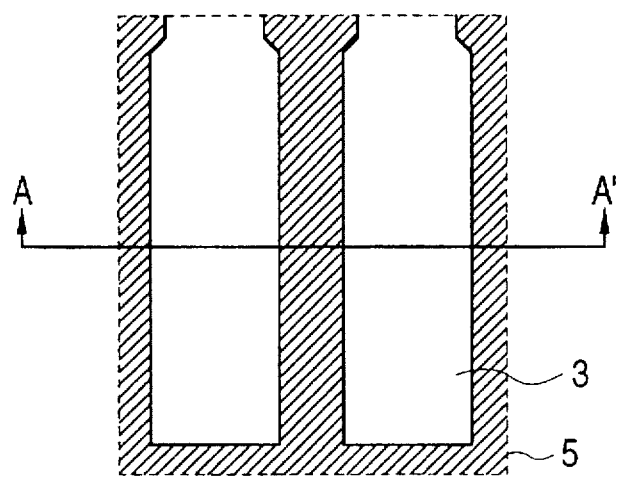
FIG. 9(a) is a plan view of a device isolating region.
Figure 9B:
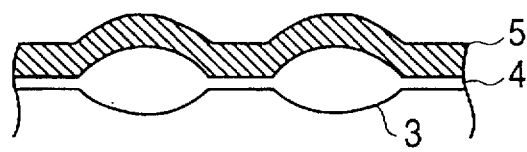
FIG. 9(b) is a sectional view at A—A' line of the device isolating region of FIG. 9(a).

Next, a gate oxide layer 4 of a thickness in the range of 10 to 25 nm and a floating gate 5, polysilicon layer, of a thickness in the range of 50 to 150 nm are formed over the surface of the silicon substrate 1. By photolithography, a mask is patterned with a photoresist and etching is carried out to isolate floating gate 5 in every memory cell. As shown in FIG. 9(a) and 9(b), before an isolating step, the floating gate 5 is connected to the device isolating region 3 in the memory cell region.

Figure 10A:
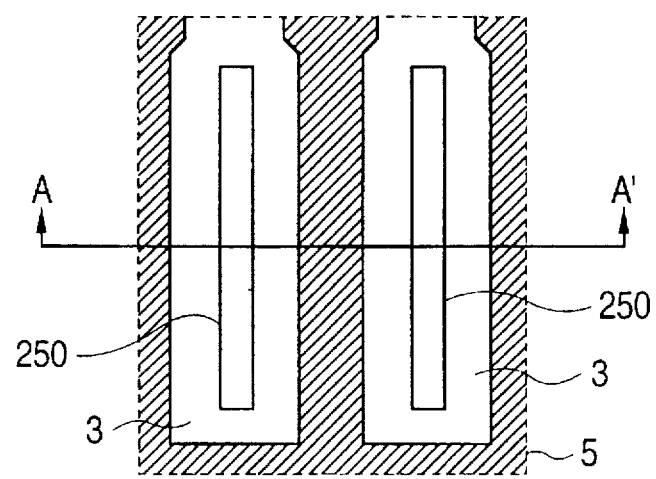
FIG. 10(a) is a plan view of a device isolating region.
Figure 10B:
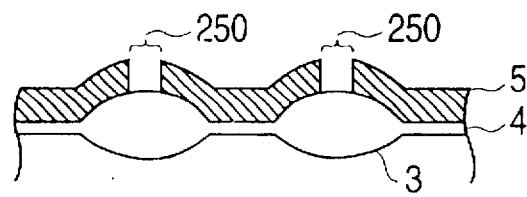
FIG. 10(b) is a sectional view of A—A' line of the device isolating region of FIG. 10(a).

As shown in FIG. 10(a) and 10(b), during the isolating step, the floating gate 5 is partly etched on the device isolating region 3 in the memory cell region. After this step, the floating gate 5 is separated into a plurality of floating gates 5. There are cut away portions 250 on every isolating region 3 in the memory cell region. Next, an interlayer insulating layer of a thickness in the range of 20 to 30 nm, for example, an ONO layer 6, is formed.

Figure 1B:
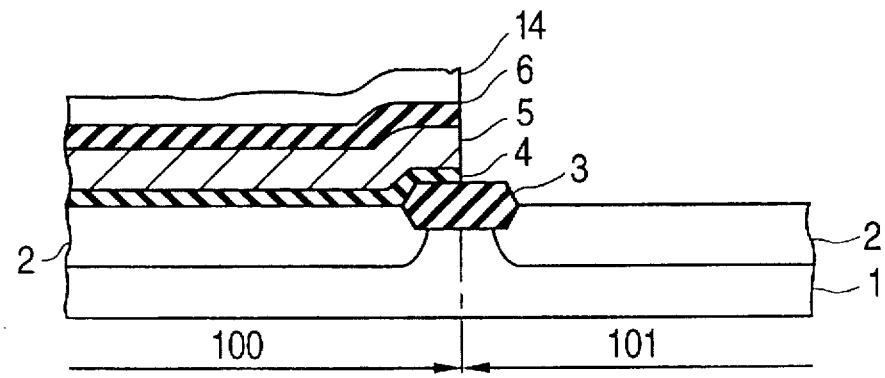

Next, in the step shown in FIG. 1(b), a mask consisting of a photoresist 14 is formed on the ONO layer 6 of a memory cell area 100 by photolithography and then the ONO layer 6, the floating gate 5, and the gate oxide layer 4 of a peripheral circuit transistor area 101 having no memory cells are removed until the well region 2 is exposed.

Figure 1C:
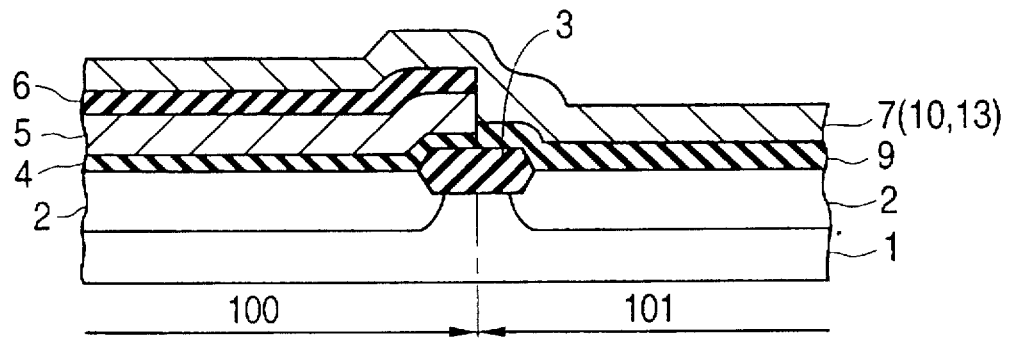
Figure 1D:
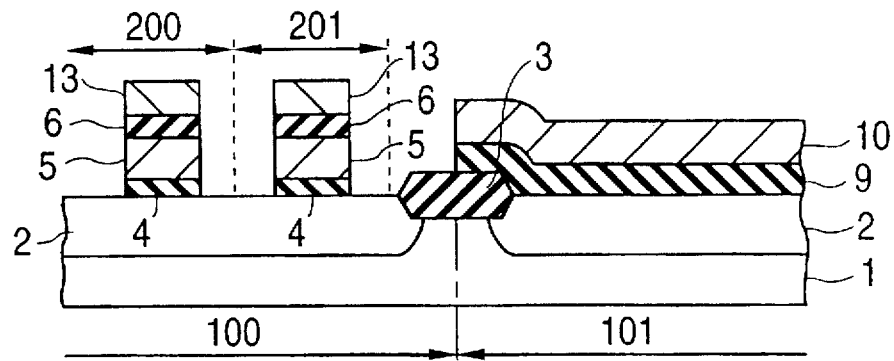

In the step shown in FIG. 1(c), a gate oxide layer 9 of a thickness in the range of 25 to 50 nm is first formed over the surface of the silicon substrate 1 in the peripheral circuit transistor area 101 and a control gate 7 (polysilicon layer: 10, 13) of a thickness of 350 nm is then formed over the surface of the silicon substrate 1. Next, memory cell sections 200, 201 as shown in FIG. 1(d) are formed by photolithography.

It is to be understood that the memory cell sections and peripheral circuit transistor sections shown in the figures may, and typically do, include multiple memory cells and peripheral circuit transistors. For ease in explanation, one of the memory cells in each section 200, 201 and one of the peripheral circuit transistors in each section 300, 301 are described herein.

Figure 1E:
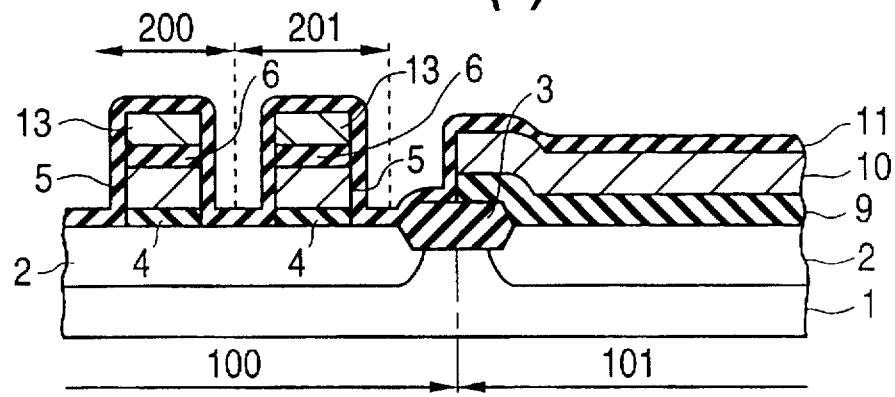
Figure 1F:
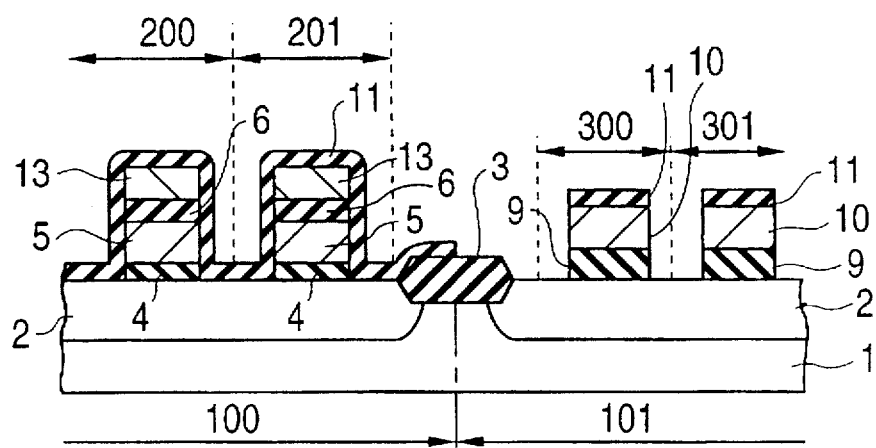

Next, in the step shown in FIG. 1(e), an oxidation-resistant layer of a thickness on the order of 20 nm, for example, a silicon nitride layer 11, is formed over the surface of the silicon substrate 1. Thereafter, peripheral circuit transistors 300, 301 as shown in Fig. 1 (f) are formed on the peripheral circuit transistor area 101 by photolithography. As a result, the gates of the peripheral circuit transistors 300, 301 have the silicon nitride layer 11 left only on the top of their gates.

Figure 1G:
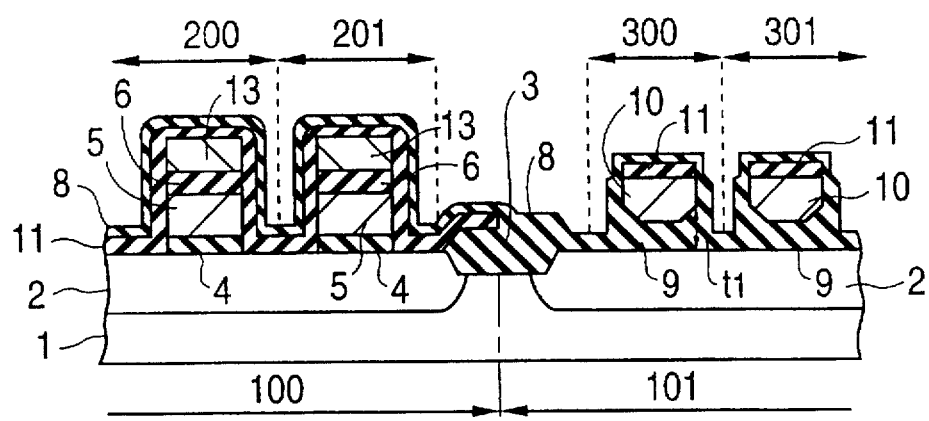

After that, in the step shown in FIG. 1(g), thermal oxidation is carried out to form an after-oxide layer 8 over the surface of the silicon substrate 1. Since the memory cell sections 200, 201 are coated with the silicon nitride layer 11, the oxidation of the ONO layer 6 between the edge of the control gate 13 and the edge of the floating gate 5 and portions of the gate oxide layer 4 between the floating gate 5 and the source/drain diffusion layer 2, which are located at both the lower ends of the floating gate 5, is suppressed.

Thus, a decrease or variation in the coupling ratio can be prevented, eliminating a degradation in the cell characteristics.

On the other hand, since the silicon nitride layer 11 is not formed on the side walls of the peripheral circuit transistors 300, 301, the gate oxide layer 9 between the lower edge of the gates of the peripheral circuit transistors 300, 301 and the diffusion layer 2 formed by thermal oxidation can have a sufficient thickness t1. This occurs because the after-oxide layer 8 and gate oxide layer form a unified oxide layer 8, 9 in which the thickness t1 of gate oxide layer 9 increases due to the formation of the after-oxide layer 8.

In subsequent steps, an interlayer insulating layer is deposited, contact holes are opened, and electrode lines are formed, which are carried out in the same way as with general semiconductor devices.

Usually, the surface breakdown voltage of a transistor is determined by an oxide layer electric field at the edge of the gate with which the gate diffusion layer of the transistor overlaps. Thus, by rounding the lower edge corners of only peripheral transistors which are impressed with a higher electric field than the cell transistors, the performance required of each cell and peripheral transistor can be achieved.

Further, the coating of the silicon nitride layer makes it difficult for mobile ions, such as Na+, from outside to intrude into memory cells. This will remedy the problem that occurs when mobile ions neutralize electrons that have been introduced into the floating gate causing data inversion.

Although, in the first embodiment, no silicon nitride layer forming method has been particularly described, the oxidation-resistant layer may be formed by a technique, such as LPCVD, plasma nitriding, direct nitriding, etc., so long as the advantages of the present invention can be achieved.

Figure 1H:
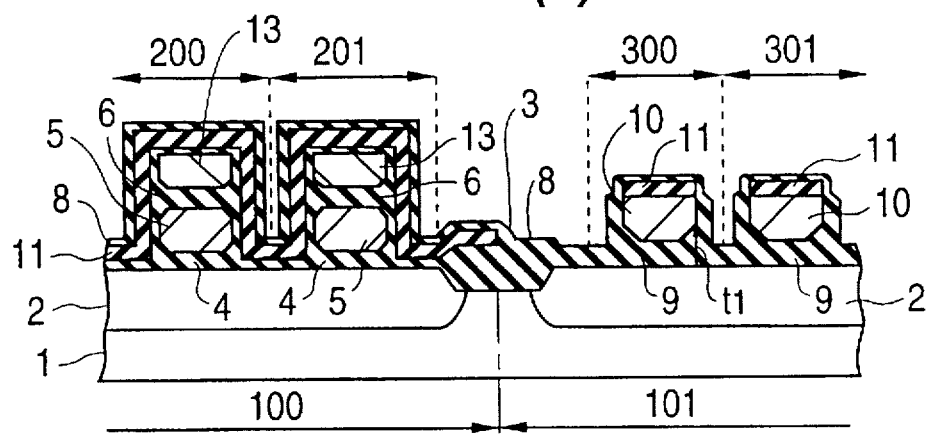

In addition, although, in the first embodiment, the silicon nitride layer is formed immediately after the cell transistor processing, a very thin oxide layer of a thickness on the order of, e.g., 8 nm may be formed prior to the formation of the silicon nitride layer. Since the electric field concentration in a transistor occurs at the edge of its gate, the quality of the oxide layer deteriorates easily in this region. In practice, for increased reliability, the cell area should preferably be slightly oxidized to round the cell gate edge corners. Such an example is illustrated in FIG. 1(h).

For the following embodiments, both of the described techniques may be used. As a typical example, the case where the formation of a thin oxide layer is omitted will be described. In the above-described first embodiment, after memory cells are formed, a silicon nitride layer is formed over the entire surface and then peripheral circuit transistors are processed. After formation over the entire surface, however, a portion of the silicon nitride layer that is located over only the peripheral circuit transistor area may be removed.

Next, a method of manufacturing a semiconductor device according to a second embodiment will be described with reference to FIGS. 2(a) to 2(h) illustrating, in sectional form, the steps of manufacture.

Figure 2A:
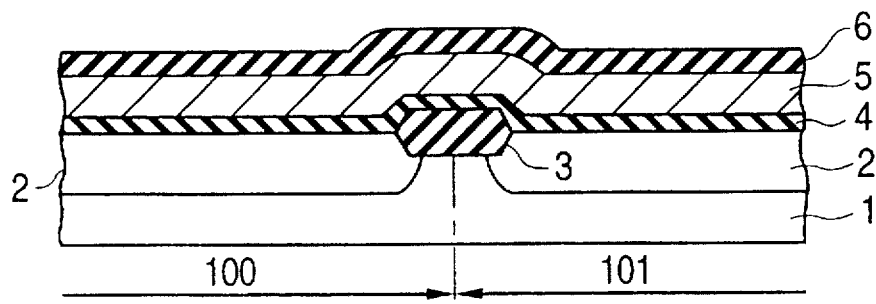
FIG. 2 (a)–2 (g) illustrates, in sectional form, a semiconductor manufacturing method according to a second embodiment of the present invention.

As with the above-described first embodiment, in the step shown in FIG. 2(a), after a diffusion (well) region 2 is formed in an N-type silicon substrate 1, selective oxidation is carried out using device isolation techniques, as described above with respect to the first embodiment, to form a device isolation region 3 consisting of a silicon oxide layer of a thickness of 500 nm. Then, a gate oxide layer 4 of a thickness in the range of 10 to 25 nm and a polysilicon gate 5, polysilicon layer, of a thickness in the range of 50 to 150 nm are formed in sequence over the surface of the silicon substrate 1. By photolithography, a photoresist serving as a mask is formed and etching is carried out to separate the floating gate 5 into adjacent pieces which are left floating in electrical potential. After that, an interlayer insulating layer of a thickness in the range of 20 to 30 nm, for example, an ONO layer 6, is formed.

Figure 2B:
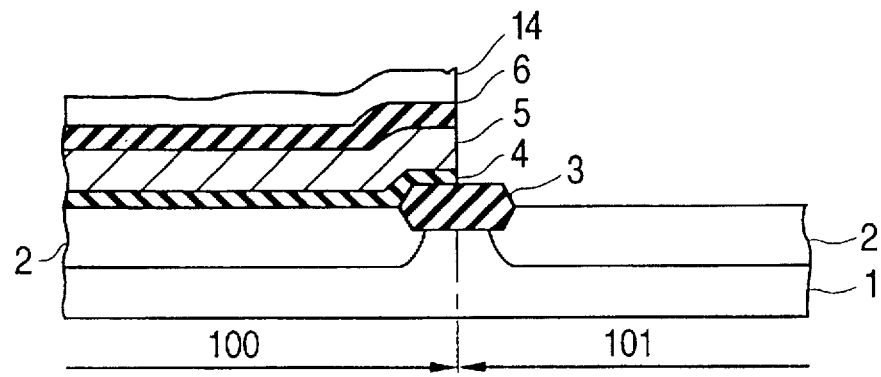

Next, in the step shown in FIG. 2(b), a photoresist 14 is formed on the ONO layer 6 in a memory cell area 100. By using the photoresist 14 as a mask, the gate oxide layer 4, the floating gate 5 and the ONO layer 6 located only over a peripheral circuit transistor area 101 having no memory cells are removed until the diffusion (well) region 2 is exposed.

Figure 2C:
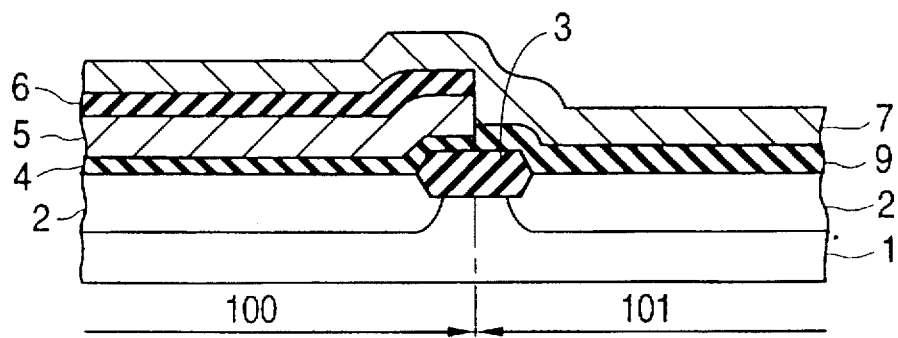
Figure 2D:
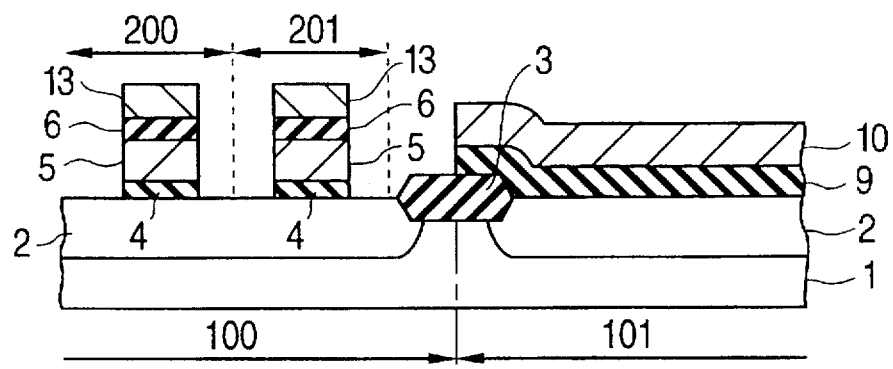

In the step shown in FIG. 2(c), a gate oxide layer 9 of a thickness in the range of 25 to 50 nm is first formed over the surface of the silicon substrate 1 in the peripheral circuit transistor area 101 and a control gate 7 (polysilicon layer: 10, 13) of a thickness of 350 nm is then formed over the surface of the silicon substrate 1. Then, by photolithography, memory cell sections 200, 201 are formed as shown in FIG. 2(d). The above steps are the same as those in the first embodiment.

Figure 2E:
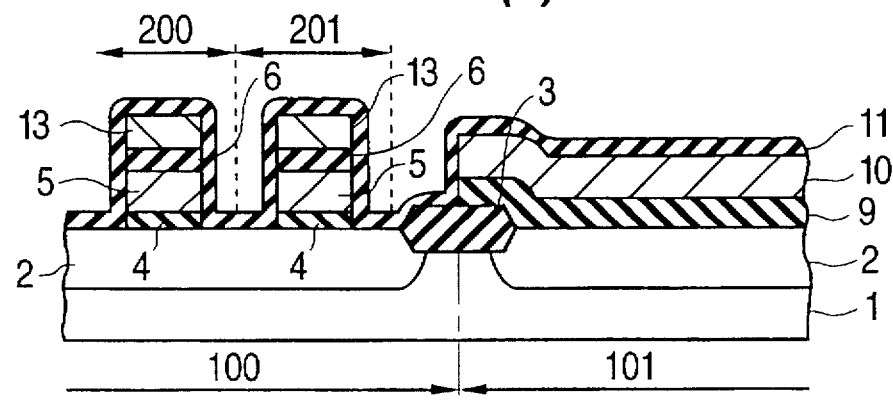
Figure 2F:
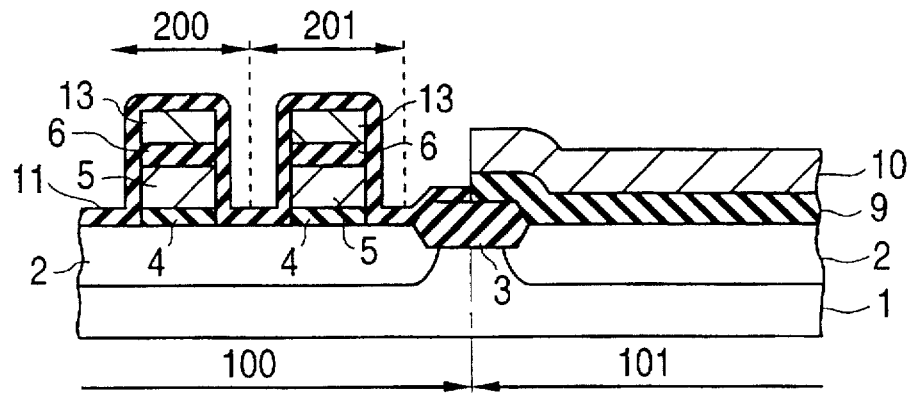
Figure 2G:
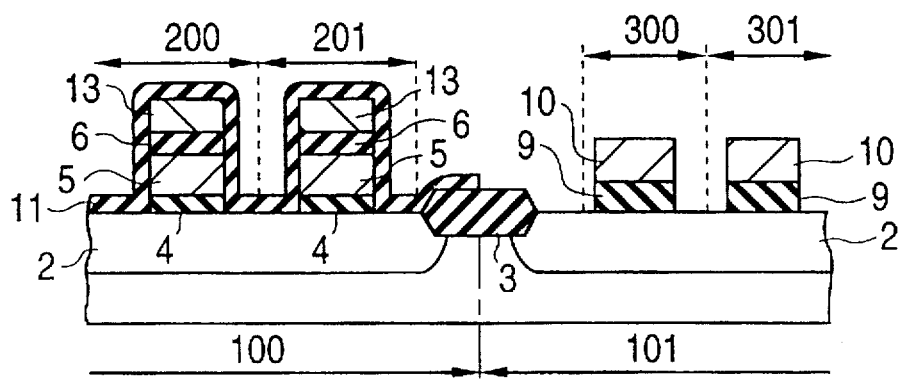

Next, as shown in FIG. 2(e), an oxidation-resistant layer of a thickness of the order of 20 nm, for example, a silicon nitride layer 11, is formed over the surface of the semiconductor substrate 1. Then etching is carried out using photolithography to remove the silicon nitride layer 11 only over the peripheral transistor area 101 as shown in FIG. 2(f) and to form peripheral circuit transistors 300, 301 as shown in FIG. 2(g). Thereby, the silicon nitride layer 11 on the side wall of each of the peripheral circuit transistors 300, 301 and on the top surface thereof can be removed.

Figure 2H:
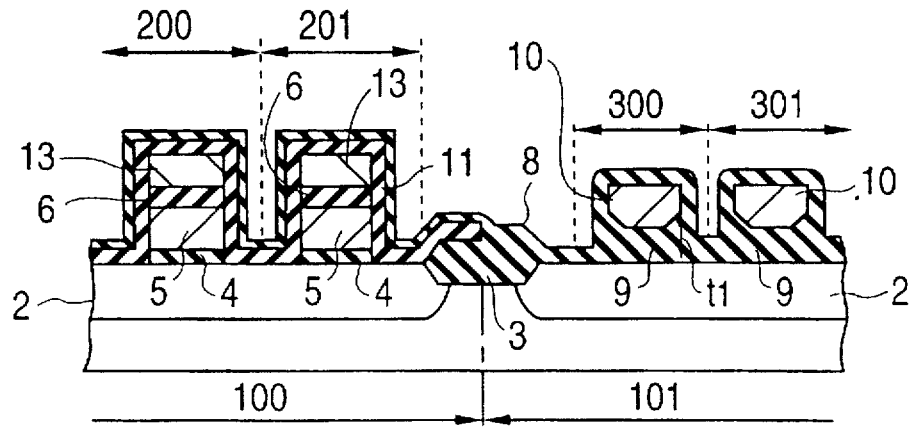

After that, as shown in FIG. 2(h), an after-oxide layer 8 is formed by thermal oxidation on the surface of the semiconductor substrate 1. The advantages obtained by these steps are identical to those in the first embodiment.

In the above first and second embodiments, the silicon nitride layer is left on the entire surface of the memory cell area. Next, a third embodiment in which the silicon nitride layer on the select transistor area within the memory cell area is removed will be described.

In FIGS. 3(a) to 3(h), there are shown sectional views illustrating a semiconductor manufacturing method according to the third embodiment in the order of steps of manufacture.

Figure 3A:
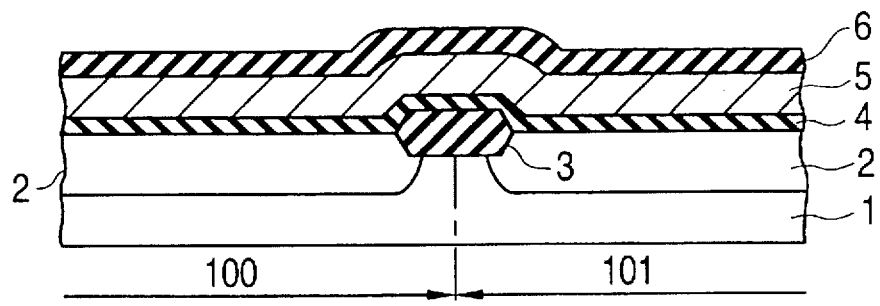
FIG. 3 (a)–3 (h) illustrates, in sectional form, a semiconductor manufacturing method according to a third embodiment of the present invention.

As with the above-described first embodiment, in the step shown in FIG. 3(a), after a diffusion (well) region 2 is formed in an N-type silicon substrate 1, selective oxidation is carried out using device isolation techniques, as discussed above with respect to the first embodiment, to form a silicon oxide layer of a thickness of 500 nm which serves as a device isolation region 3.

After that, a gate oxide layer 4 of a thickness in the range of 10 to 25 nm and a floating gate 5, polysilicon layer, of 50 to 150 nm are formed in sequence over the surface of the semiconductor substrate 1. By photolithography, etching is carried out to separate the first polysilicon layer 5 into adjacent floating gates. Then, an interlayer insulating layer of a thickness in the range of 20 to 30 nm, for example, an ONO layer 6, is formed.

Figure 3B:
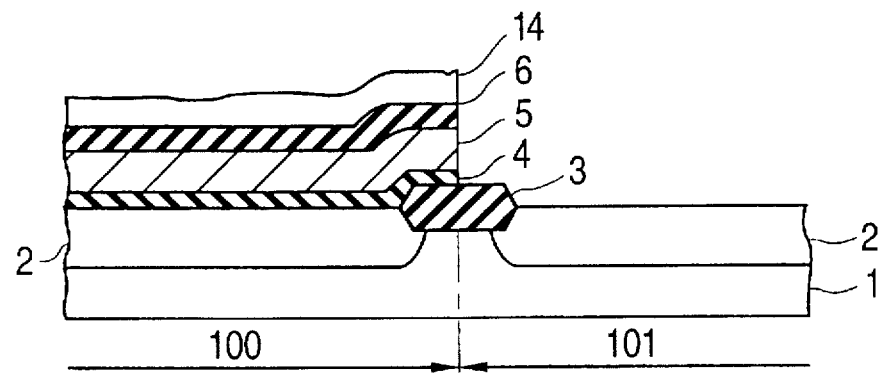

Next, in the step shown in FIG. 3(b), a photoresist 14 is formed on the ONO layer 6 in the memory cell area 100. By using the photoresist as a mask, only the peripheral circuit transistor area 101 having no memory cells is subjected to etching operations until the diffusion (well) region 2 in the peripheral circuit transistor area 101 is exposed.

Figure 3C:
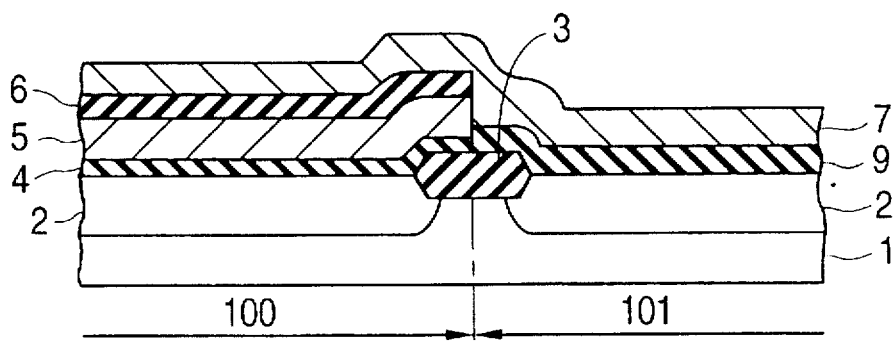
Figure 3D:
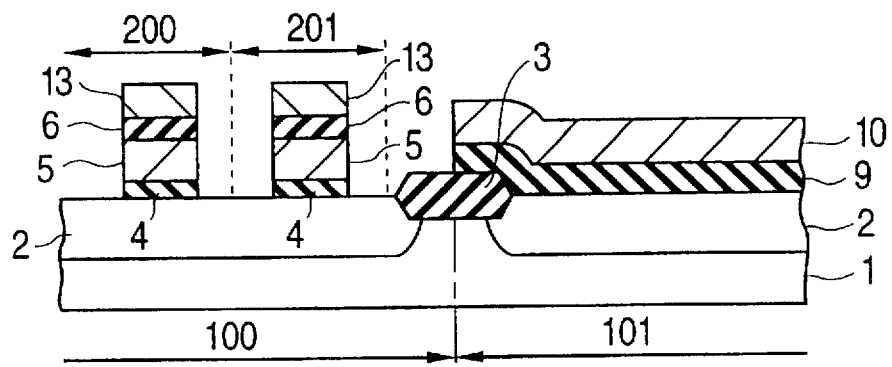

In the step shown in FIG. 3(c), a gate oxide layer 9 of a thickness in the range of 25 to 50 nm is first formed over the surface of the silicon substrate 1 in the peripheral circuit transistor area 101 and a control gate 7 (polysilicon layer: 10, 13) of a thickness of 350 nm is then formed over the surface of the silicon substrate 1. Then, by photolithography, memory cell sections 200, 201 are formed as shown in FIG. 3(d).

Figure 3E:
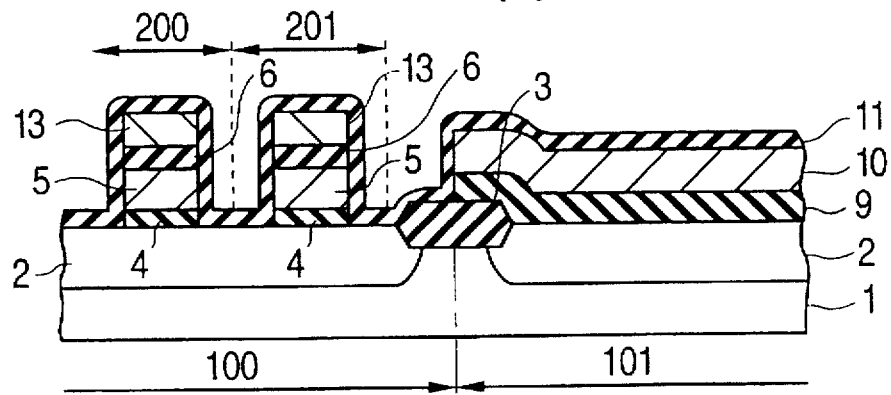
Figure 3F:
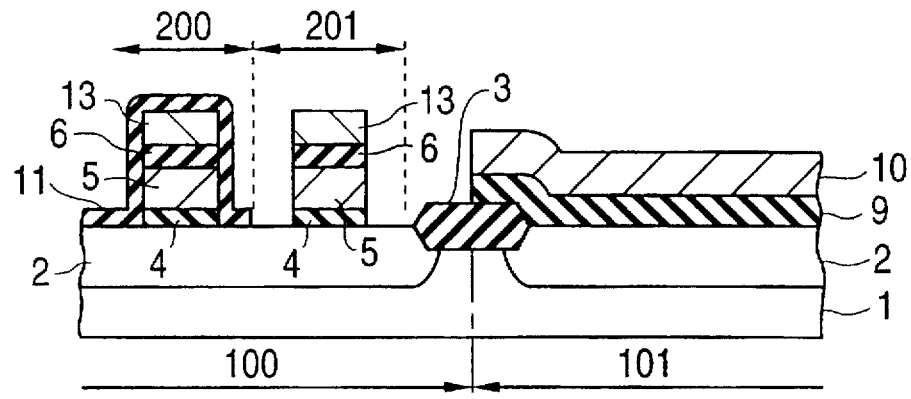
Figure 3G:
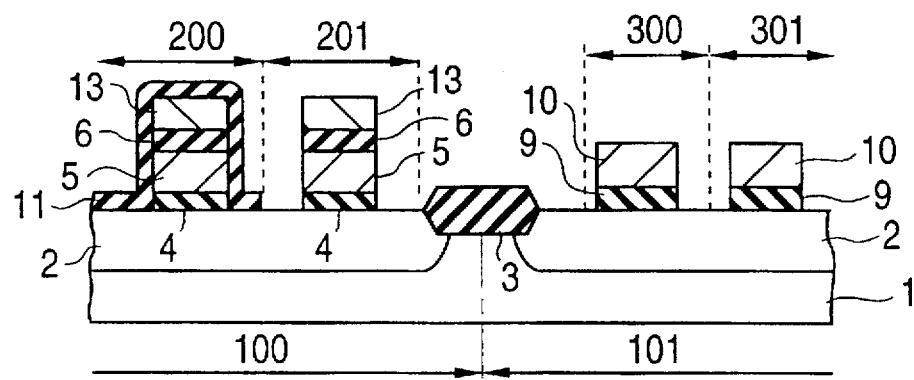
Figure 3H:
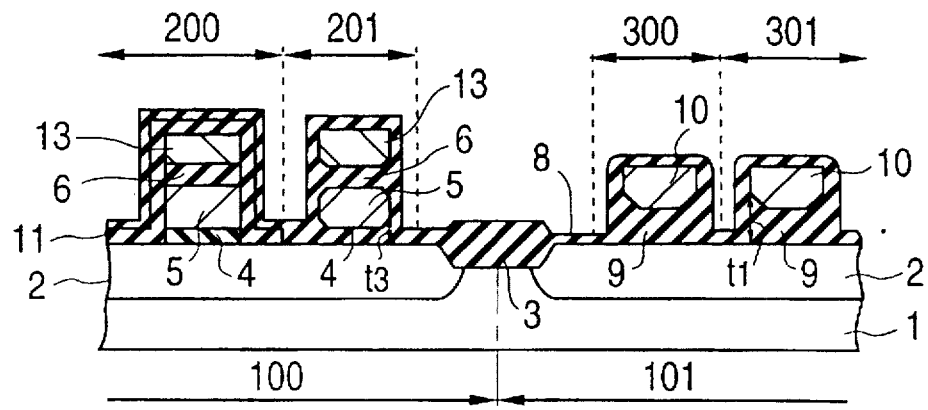

Next, as shown in FIG. 3(e), an oxidation-resistant layer of a thickness of the order of 20 nm, for example, a silicon nitride layer 11, is formed over the surface of the semiconductor substrate 1 and then etched by photolithography. By this etching process, the silicon nitride layer 11 on the peripheral circuit transistor area 101 and the memory cell section 201 (a select transistor area) is removed as shown in FIG. 3 (f). Thereby, as shown in FIG. 3 (g), the silicon nitride layer 11 located on the side walls and the top surface of each of the gates of the peripheral circuit transistors 300, 301 and the select transistors in the memory cell section 201 is removed.

After that, as shown in FIG. 3 (h), an after-oxide layer 8 is formed on the surface of the semiconductor substrate 1 by thermal oxidation. In addition to the advantages described in connection with the first embodiment, another advantage obtained by these steps include the capability of making the gate oxide layer 4 between the select transistor gate edge and the diffusion layer 2 thick (t3) so that the breakdown voltage of the select transistors can be increased.

Although, in the present embodiment, the silicon nitride layer 11 is formed after the formation of memory cells 200, 201 and prior to the formation of peripheral circuit transistors 300, 301, the layer 11 may be formed over the entire surface after forming the peripheral circuit transistors 300, 301.

In FIGS. 4(a) to 4(h) there are shown sectional views illustrating a semiconductor device manufacturing method according to a fourth embodiment in the order of steps of manufacture, which will be described below.

Figure 4A:
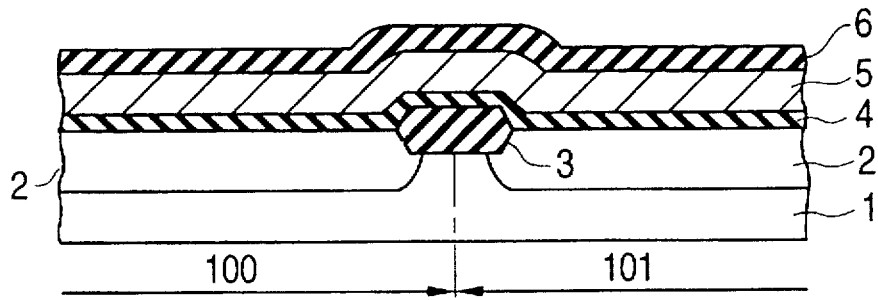
FIG. 4 (a)–4 (h) illustrates, in sectional form, a semiconductor manufacturing method according to a fourth embodiment of the present invention.
Figure 4B:
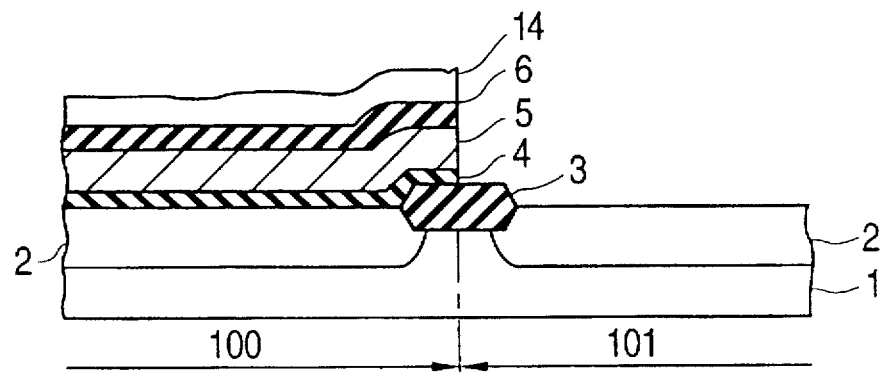
Figure 4C:
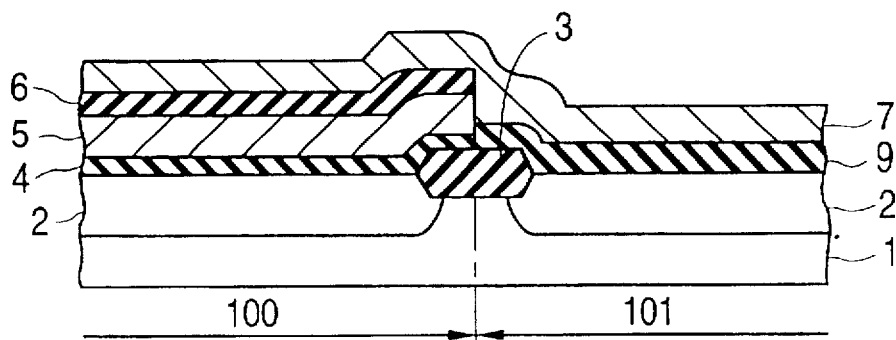
Figure 4D:
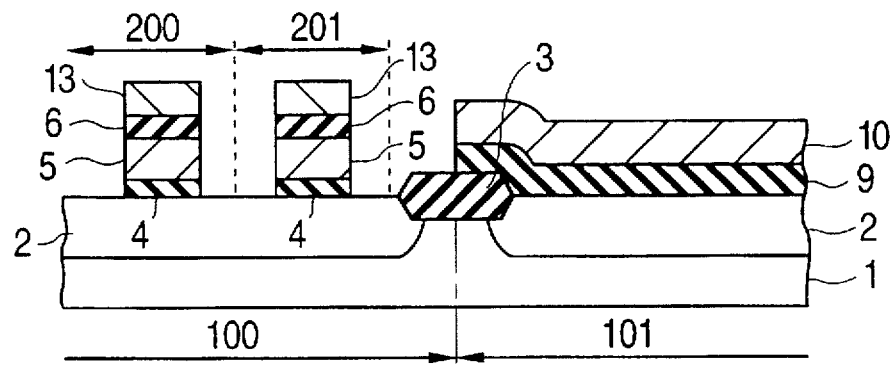
Figure 4E:
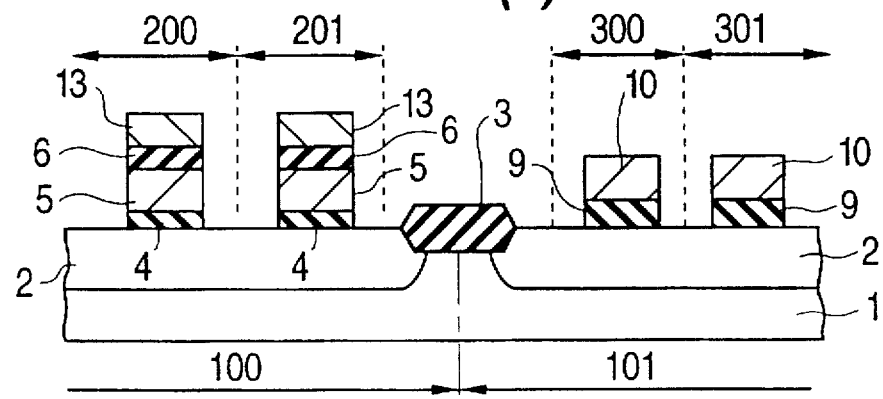
Figure 4F:
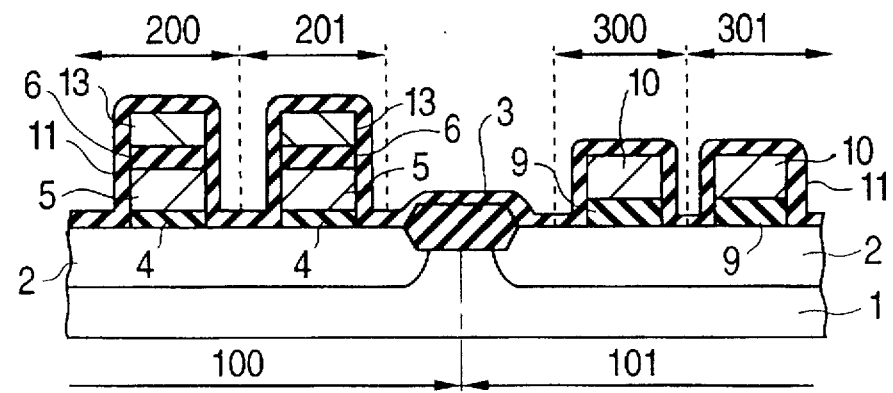
Figure 4G:
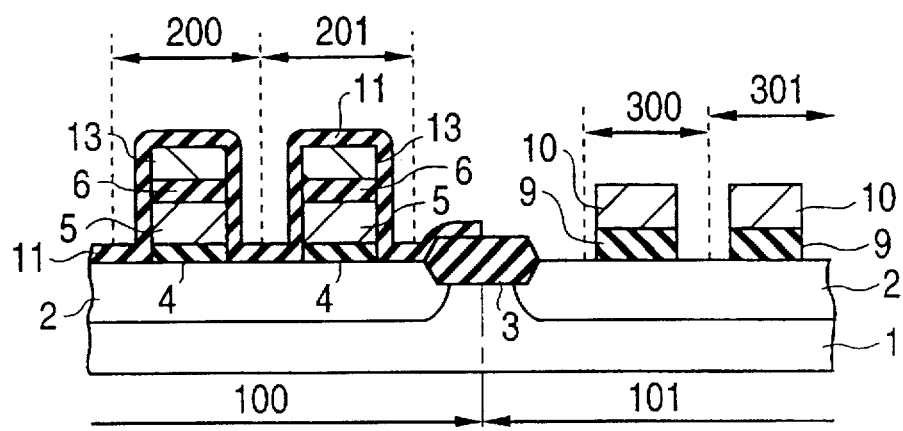
Figure 4H:
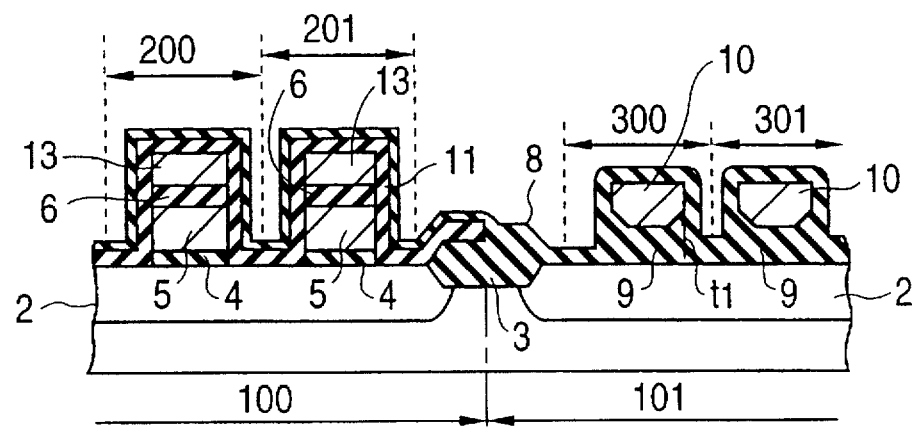

As with the first embodiment, memory cell sections 200, 201 are formed in accordance with the steps shown in FIGS. 4(a) to 4(d). After that, peripheral circuit transistors 300, 301 are formed as shown in FIG. 4(e).

Next, as shown in FIG. 4 (f), a silicon nitride layer 11 of a thickness of, e.g., 20 nm is formed over the entire surface. After that, as shown in FIG. 4(g), only the silicon nitride layer 11 that is located over the peripheral circuit transistor area 101 is etched away by CDE (chemical dry etching).

After that, as shown in FIG. 4 (h), thermal oxidation is carried out to form an after-oxide layer 8 over the entire surface, thereby achieving the same advantages as the first embodiment.

Next, a semiconductor manufacturing method according to a fifth embodiment will be described. Although, in the above-described fourth embodiment, the silicon nitride layer 11 having no memory cells is removed only for the peripheral circuit transistor area 101, in the fifth embodiment, the silicon nitride layer 11 on the memory cell section 201 (a select transistor) within the memory cell area 100 is also removed.

FIGS. 5(a) to 5(h) are sectional views illustrating the semiconductor manufacturing method according to the fifth embodiment in the order of steps of manufacture.

Figure 5A:
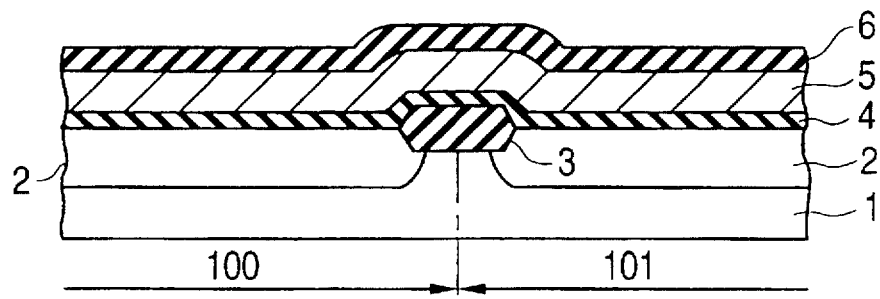
FIG. 5 (a)–5 (h) illustrates, in sectional form, a semiconductor manufacturing method according to a fifth embodiment of the present invention.
Figure 5B:
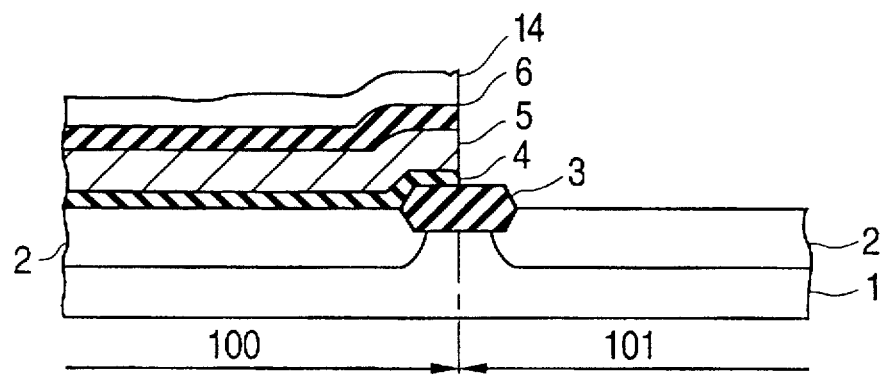
Figure 5C:
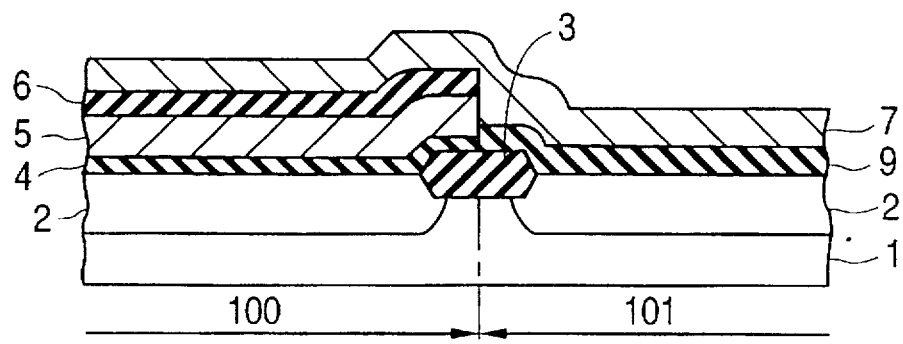
Figure 5D:
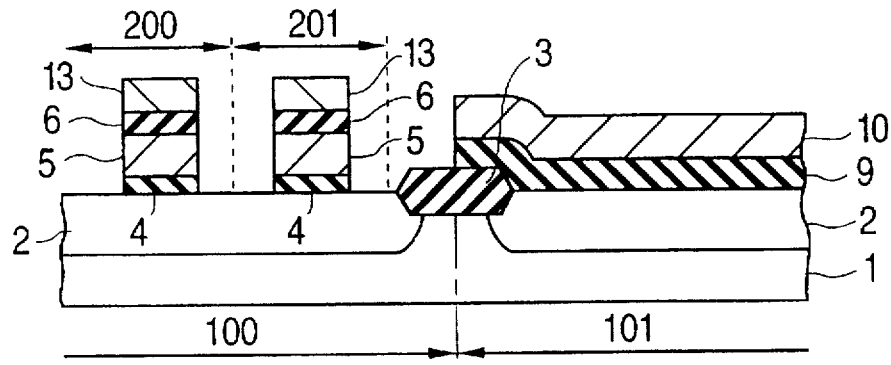
Figure 5E:
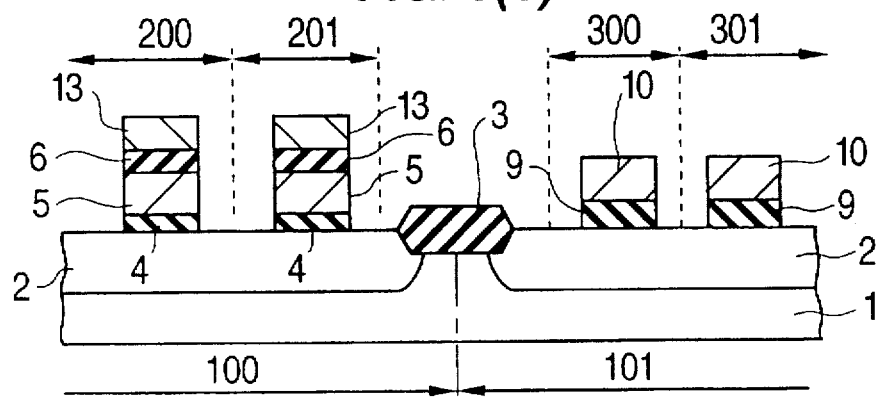
Figure 5F:
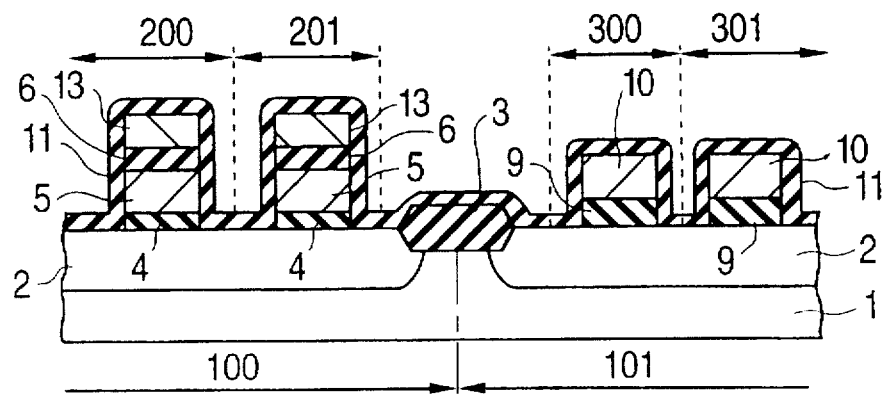

As in the first embodiment, as shown in FIGS. 5(a) to 5(d), memory cell sections 200, 201 are formed. After that, as shown in FIG. 5(e), peripheral circuit transistors 300, 301 are formed. Next, as shown in FIG. 5(f), a silicon nitride layer 11 of a thickness of, e.g. 20 nm, is formed.

Figure 5G:
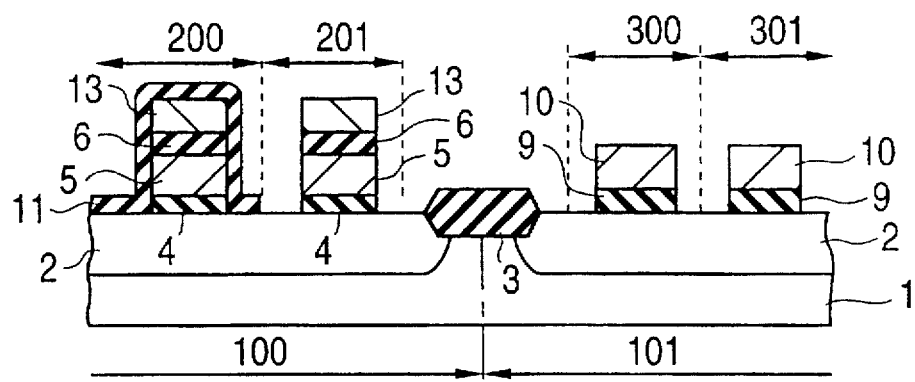

Then, the silicon nitride layer 11 on the peripheral transistor area 101 having no memory cells and the memory cell section 201 (select transistor) within the memory cell area 100 is etched away by CDE, resulting in the structure shown in FIG. 5(g).

Figure 5H:
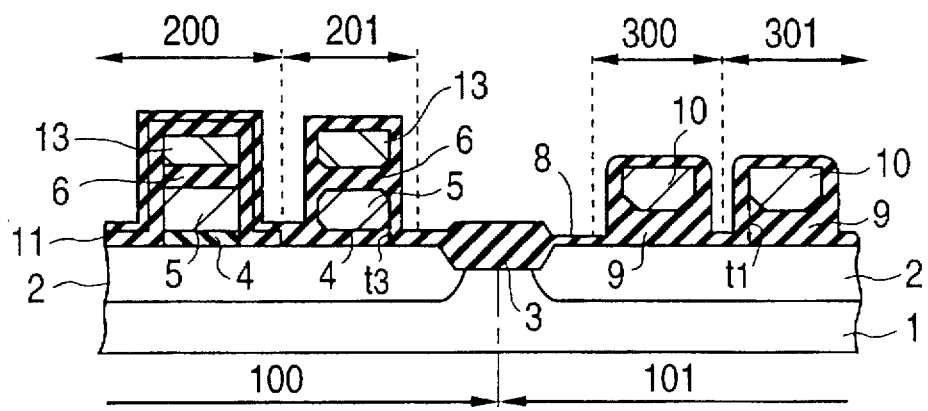

After that, the surface of the semiconductor substrate 1 is subjected to thermal oxidation to form an after-oxide layer 8 as shown in FIG. 5(h), thus obtaining the same advantages as the third embodiment.

In the fourth embodiment, the silicon nitride layer 11 is removed from the peripheral circuit transistor area 101. In a NAND type EEPROM, peripheral circuit transistors 300, 301 include transistors impressed with voltages in the range of the supply voltage to 12V and high voltage transistors impressed with voltages in the range of 8V to 30V.

According to the sixth embodiment, the silicon nitride layer 11 is removed only from the high-voltage transistor area (peripheral circuit transistor) 300. FIGS. 6(a) to 6(h) are sectional views illustrating a semiconductor manufacturing method according to the sixth embodiment.

Figure 6A:
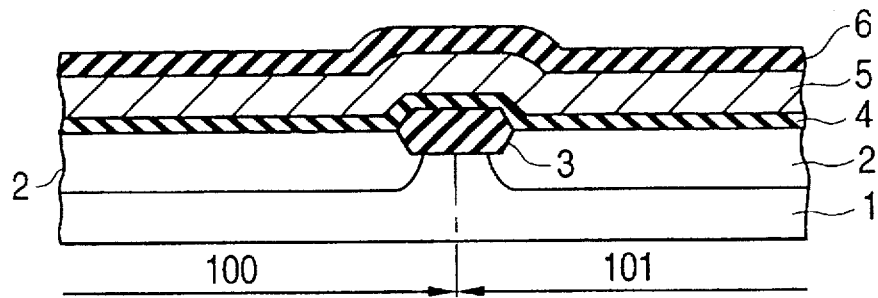
FIG. 6 (a)–6 (h) illustrates, in sectional form, a semiconductor manufacturing method according to a sixth embodiment of the present invention.
Figure 6B:
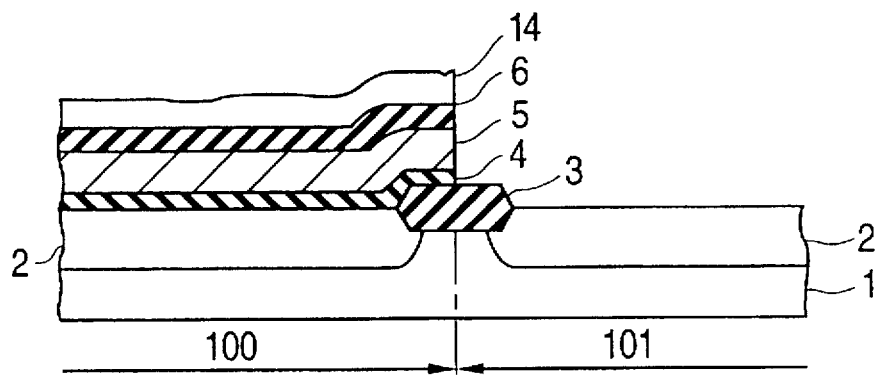
Figure 6C:
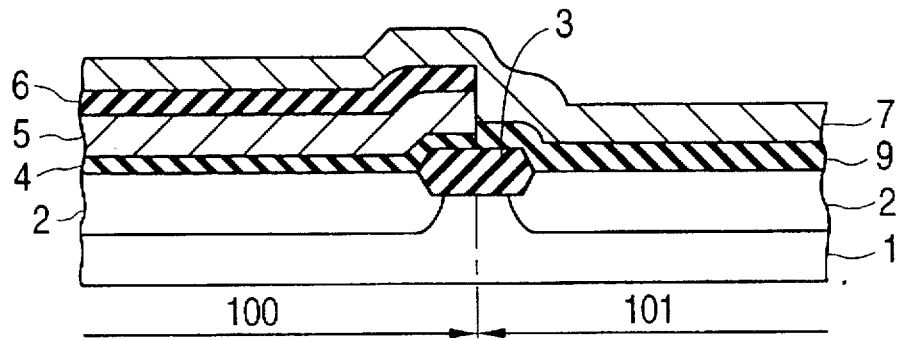
Figure 6D:
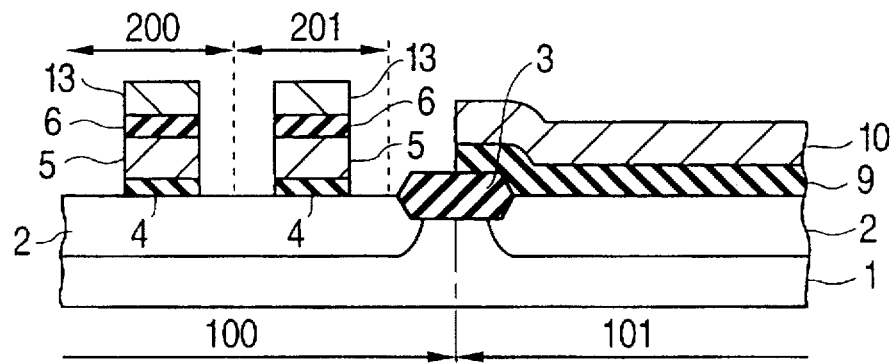
Figure 6E:
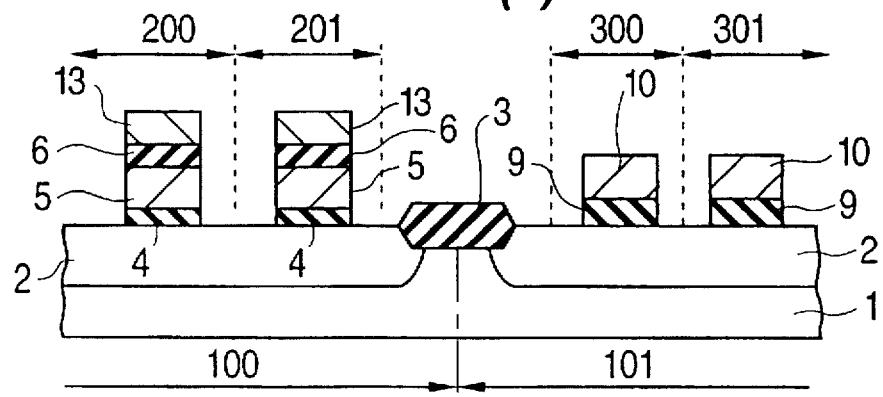

As with the above-described first embodiment, a memory cell area 100 is formed on a well region 2 in an N-type silicon substrate 1 as shown in FIGS. 6(a) to 6(d). After that, peripheral circuit transistors 300, 301 are formed as shown in FIG. 6(e).

Figure 6F:
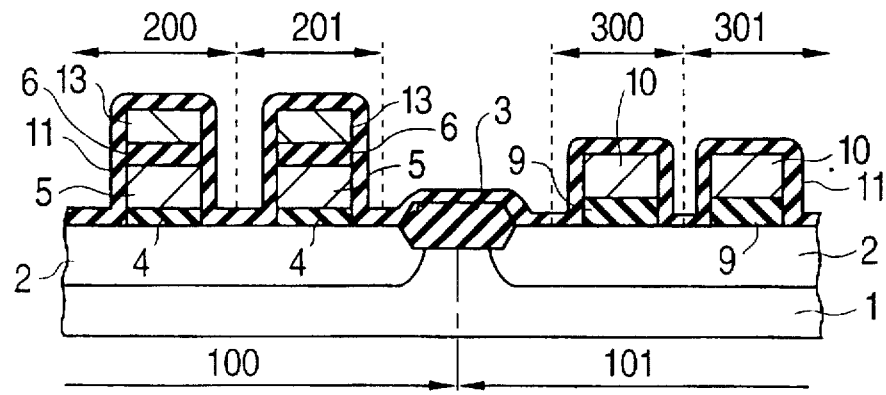

Next, as shown in FIG. 6(f), a silicon nitride layer 11 of a thickness of the order of, e.g., 20 nm is formed over the surface of the semiconductor substrate 1.

Figure 6G:
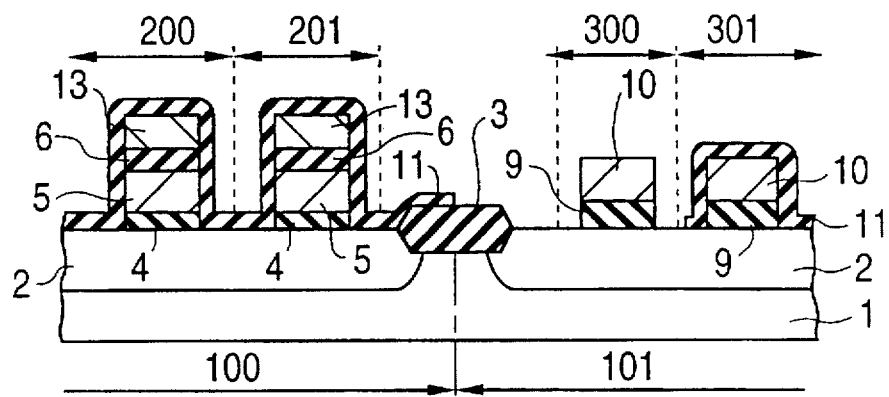
Figure 6H:
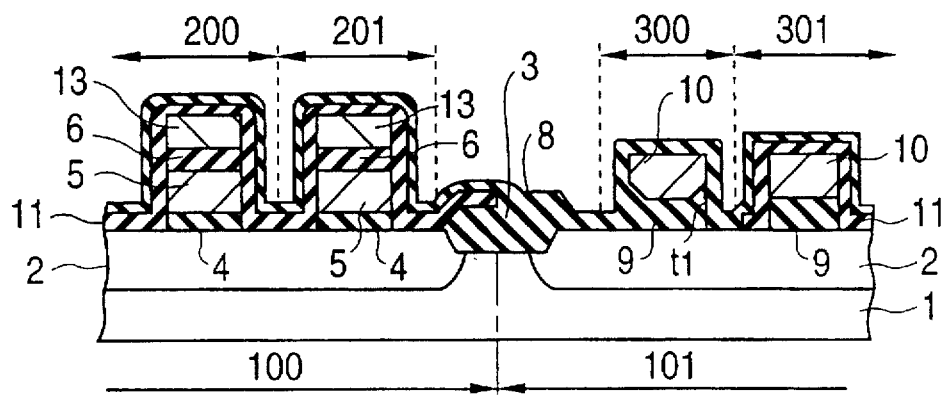

After that, as shown in FIG. 6(g), a portion of the silicon nitride layer 11 that is located only on the peripheral transistor 300 (a high-voltage transistor) is etched away by CDE.

Then, an after-oxide layer 8 is formed over the surface of the semiconductor substrate 1 by thermal oxidation as shown in FIG. 6 (h). Thermal oxidation allows only the gate oxide layer 9 between the high-voltage transistor gate edge and the diffusion layer 2 to be formed to a thickness t1 having sufficient dielectric strength. The advantages of the memory cell section are the same as those in the first embodiment.

Whereas, in the sixth embodiment, only the gate oxide layer 9 at the high voltage transistor gate edge is formed to a thickness t1 having sufficient dielectric strength, in the seventh embodiment the gate oxide layer 9 at the gate edge of a transistor 301 impressed with voltages in the range of the supply voltage to 12V is made thicker than the memory cell gate oxide layer 4 but thinner than the gate oxide layer 9 of the high voltage transistor 300.

FIGS. 7(a) to 7(j) are sectional views illustrating the semiconductor manufacturing method according to the seventh embodiment in the order of steps of manufacture.

Figure 7A:
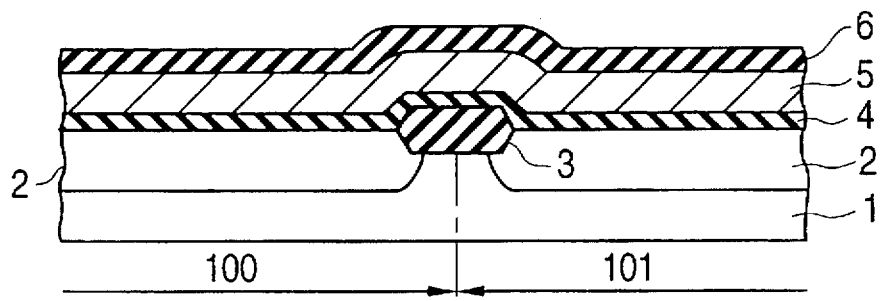
FIG. 7 (a)–7 (j) illustrates, in sectional form, a semiconductor manufacturing method according to a seventh embodiment of the present invention.
Figure 7B:
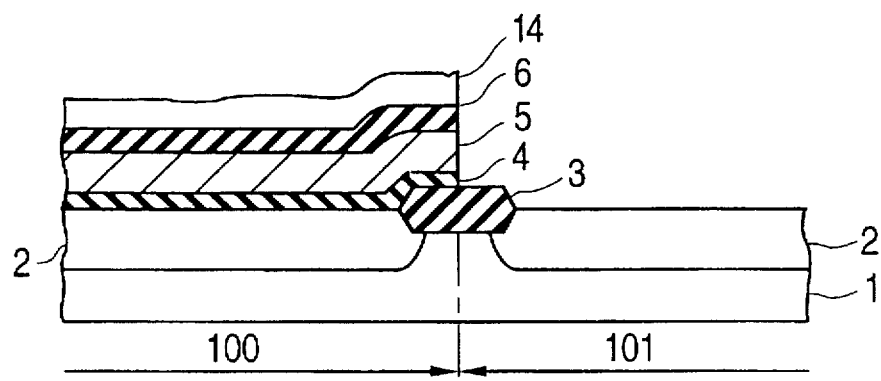
Figure 7C:
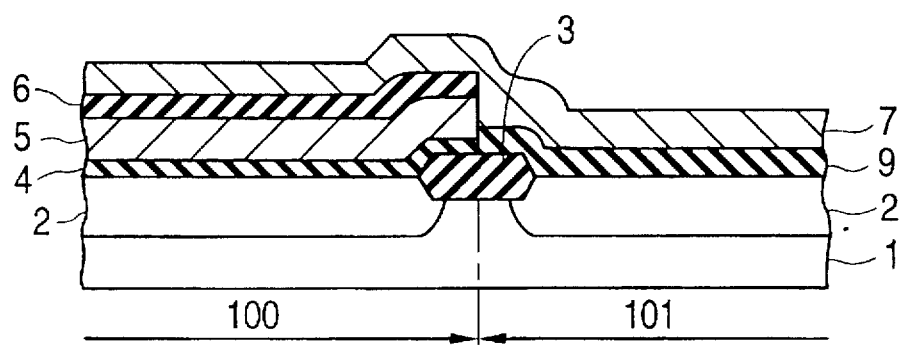
Figure 7D:
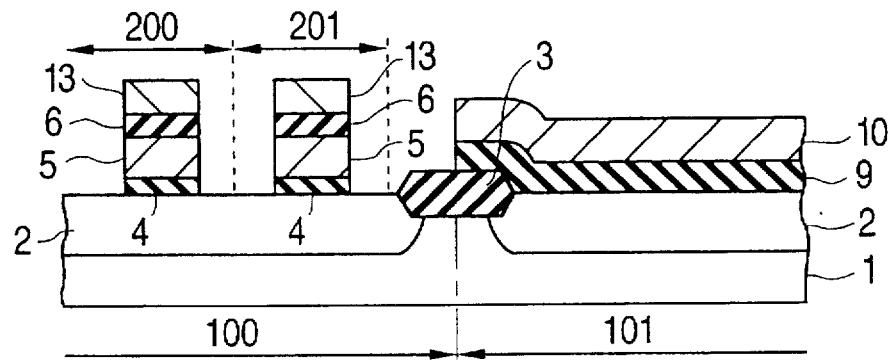
Figure 7E:
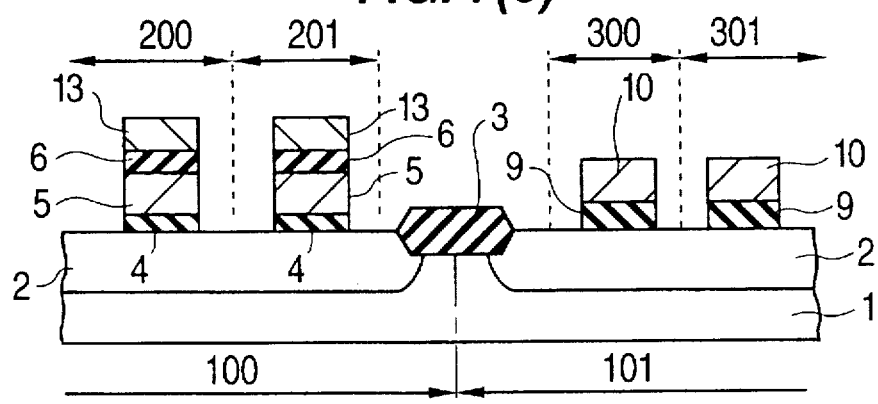

As with the above-described embodiment, a memory cell area is formed on a well region 2 in an N-type silicon substrate 1 as shown in FIGS. 7(a) to 7(d). After that, peripheral circuit transistors 300, 301 are formed as shown in FIG. 7(e).

Figure 7F:
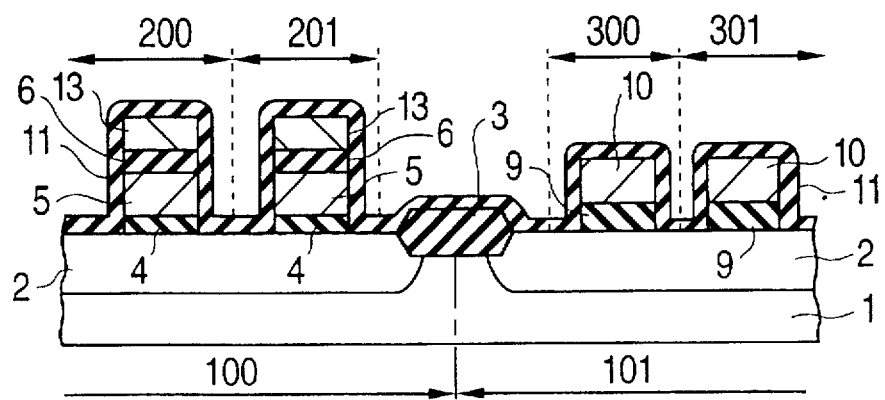
Figure 7G:
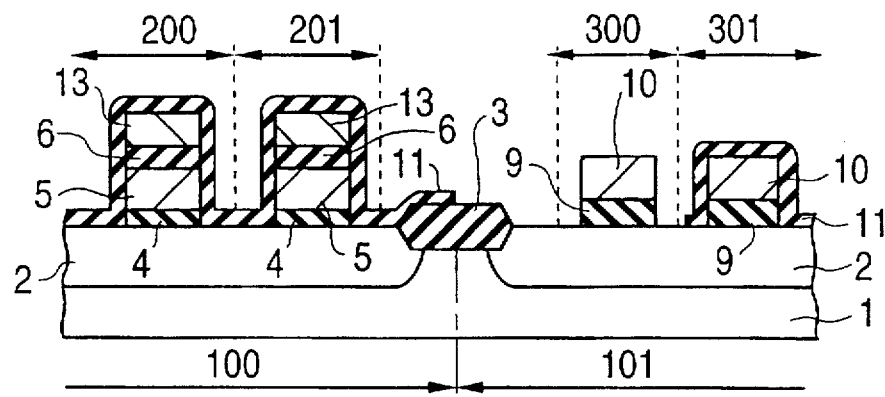

Next, as shown in FIG. 7(f), a silicon nitride layer 11 of a thickness of the order of, e.g., 20 nm is formed over the surface of the semiconductor substrate 1. Then as shown in FIG. 7(g), using photolithography, a portion of the silicon nitride layer 11 that is located only on the high-voltage transistor area 300 is etched away by CDE.

Figure 7H:
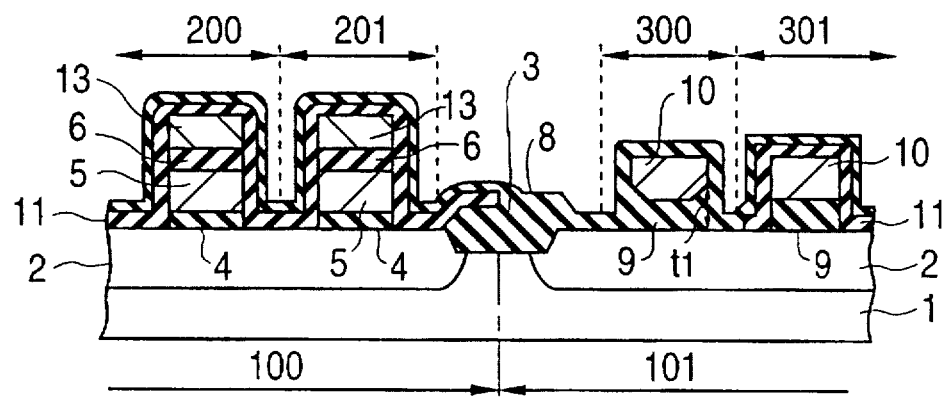
Figure 7I:
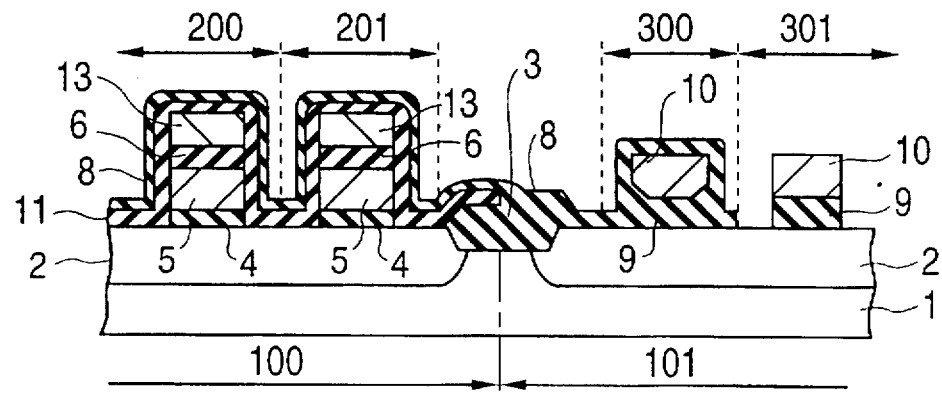
Figure 7J:
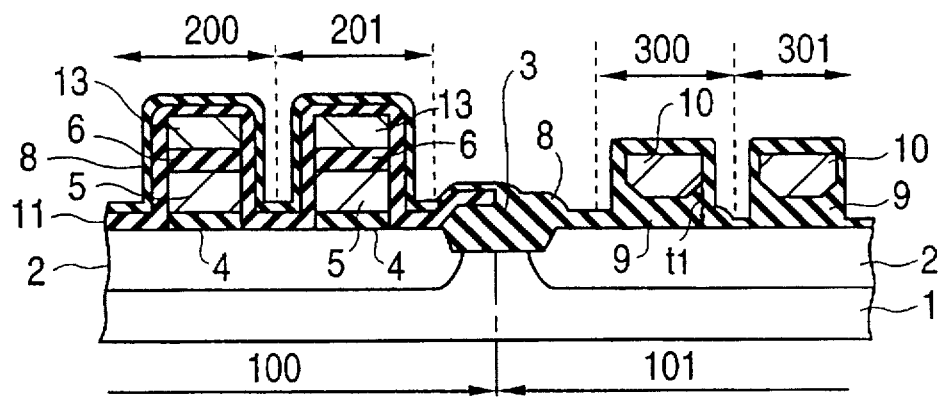
Figure 8:
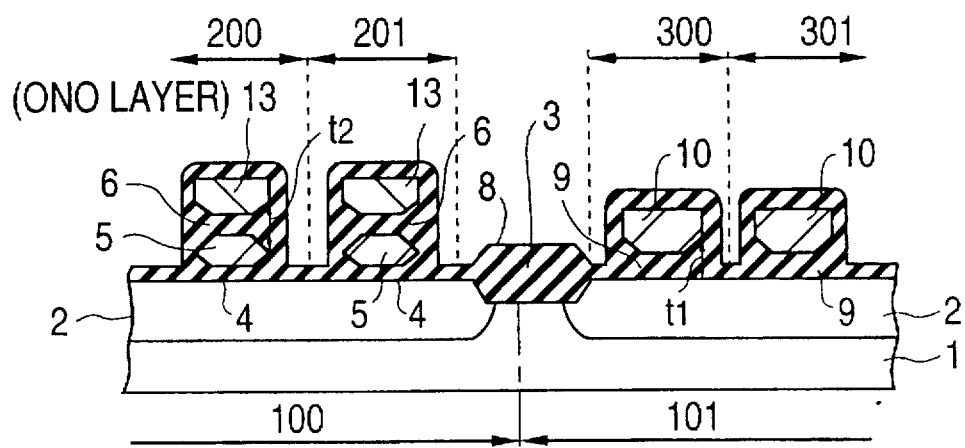
FIG. 8 is a sectional view of a conventional semiconductor memory device (NAND type EEPROM).

Further, as shown in FIG. 7(h), thermal oxidation is carried out over the surface of the semiconductor substrate 1. After that, as shown in FIG. 7(i), using photolithography, the after-oxide layer 8 on the transistor area 301 and the silicon nitride layer 11 on the transistor area 301 impressed with a voltage ranging from the supply voltage to 12V is etched away by CDE. Further, as shown in FIG. 7(j), thermal oxidation is carried out again to form an after-oxide layer 8 over the surface of the semiconductor substrate 1.

Thus, the high voltage transistor 300 is subjected to thermal oxidation twice, while the transistor 301 impressed with voltages in the range of the supply voltage to 12V is subjected to thermal oxidation once. This allows the gate oxide layer at the gate edge of each transistor to be formed to a thickness having sufficient dielectric strength, respectively. The advantages of the memory cell section are the same as those in the first embodiment.

In the above embodiments, a silicon nitride layer is used as an illustrative oxidation-resistant layer. Any other oxidation-resistant layer, such as an oxy-nitride layer, a TEOS layer, or the like, may be used.

Although each of the above embodiments has been described in terms of a NAND type EEPROM, the present invention is generally applicable to a nonvolatile semiconductor memory device having a peripheral circuit with transistors impressed with high voltages in the range of 8V to 30V.

As described above, according to the semiconductor manufacturing method according to the present embodiment, since peripheral circuit transistors have no oxidation-resistant layer, the gate oxide layer between the transistor gate edge and the diffusion layer can be formed to a thickness having sufficient dielectric strength by thermal oxidation. Moreover, since memory cells are coated with an oxidation-resistant layer, the ONO layer between the control gate edge and the floating gate edge can be prevented from being oxidized. Thus, a reduction in coupling ratio can be prevented, eliminating a degradation in cell characteristics. Furthermore, it becomes difficult for mobile ions, such as Na+, to intrude into memory cells. The present invention prevents a problem that occurs when mobile ions neutralize electrons which intrude into floating gates, causing unnecessary data inversion.

As described above in detail, according to the present invention, there can be provided a semiconductor device manufacturing method by which the interlayer insulating layer between the control gate edge and the floating gate edge of each memory cell is suitably oxidized to have sufficient dielectric strength.

Although the method of the present invention has been described with reference to a NAND type EEPROM, this invention can apply to other semiconductor devices, e.g., EEPROM, FLASH EEPROM.

According to the above mentioned description, there are a memory cell transistor in a memory cell area, a select transistor in a memory cell area, a high voltage transistor in a peripheral circuit transistor area, and a low voltage transistor in a peripheral circuit area, respectively arranged in the determined order. However, the arrangement of these transistors is not limited to the arrangement described, there are many variations.

Numerous modifications and variations of the present invention are possible in light of the above teachings. It is therefore to be understood that, within the scope of the appended claims, the present invention can be practiced in a manner other than as specifically described herein.

What is claimed is:

1. A method of manufacturing a nonvolatile semiconductor memory device formed on a semiconductor substrate, said method comprising the steps of:

forming a first multilayered structure on the semiconductor substrate comprising a plurality of memory cell sections and a second multilayered structure on the semiconductor substrate comprising a plurality of peripheral circuit transistor sections having no memory cells;

coating the first multilayered structure with an oxidation-resistant layer;

forming the oxidation-resistant layer on top of the second multilayered structure; and forming an oxide layer over an exposed surface above the semiconductor substrate by thermal oxidation.

2. A method of manufacturing a nonvolatile semiconductor memory device according to claim 1, said method further comprising the steps of:

forming a first insulating layer, a first conductive layer, and a second insulating layer on a surface region of the semiconductor substrate;

selectively removing the second insulating layer, the first conductive layer and the first insulating layer from a non-memory cell area of the surface region until the semiconductor substrate surface is exposed;

forming a third insulating layer on the semiconductor substrate surface in the non-memory cell area of the surface region;

forming a second conductive layer on the second insulating layer in a memory cell area of the surface region and on the third insulating layer in the non-memory cell area of the surface region;

selectively removing the second conductive layer, the second insulating layer, the first conductive layer, and the first insulating layer from a portion of the memory cell area;

depositing an oxidation-resistant layer on the second conductive layer and the semiconductor substrate; and selectively removing a portion of the oxidation-resistant layer, the second conductive layer and the third insulating layer in the non-memory cell area.

3. A method of manufacturing a nonvolatile semiconductor memory device according to claim 1, further comprising the steps of:

forming a first insulating layer, a first conductive layer, and a second insulating layer on a surface region of the semiconductor substrate;

selectively removing the second insulating layer, the first conductive layer and the first insulating layer until the semiconductor substrate is exposed;

forming a third insulating layer on the semiconductor substrate surface in a non-memory cell area of the surface region;

forming a second conductive layer on the second insulating layer in a memory cell area of the surface region and on the third insulating layer in the non-memory cell area;

selectively removing the second conductive layer, the second insulating layer, the first conductive layer, and the first insulating layer from a portion of the memory cell area;

depositing an oxidation-resistant layer on the second conductive layer and the semiconductor substrate;

selectively removing the oxidation-resistant layer;

selectively removing a portion of the second conductive layer and the third insulating layer from the non-memory cell area; and forming an oxide layer on the surface of the oxidation-resistant layer and the second conductive layer by thermal oxidation.

4. A method of the claim 1, wherein the oxidation-resistant layer is selected from the group consisting of a silicon nitride layer, an oxy-nitride layer, and a TEOS layer.

5. A method of manufacturing a nonvolatile semiconductor memory device with memory cell sections and peripheral circuit transistor sections having no memory cells formed on a semiconductor substrate, said method comprising the steps of:

forming a first insulating layer, a first conductive layer, and a second insulating layer on a surface region of the semiconductor substrate;

selectively removing the second insulating layer, the first conductive layer and the first insulating layer from a non-memory cell area;

forming a third insulating layer on the semiconductor substrate surface of the non-memory cell area;

forming a second conductive layer on the second insulating layer in a memory cell area and on the third insulating layer in the non-memory cell area;

selectively removing the second conductive layer, the second insulating layer, the first conductive layer, and the first insulating layer from a portion of the memory cell area;

selectively removing a portion of each of the second conductive layer and the third insulating layer from the non-memory cell area;

depositing an oxidation-resistant layer on the second conductive layer and the semiconductor substrate;

selectively removing a portion of the oxidation-resistant layer; and forming an oxide layer on the oxidation-resistant layer and the second conductive layer by thermal oxidation.

6. A method of manufacturing a nonvolatile semiconductor memory device according to claim 5, said method further comprising the steps of:

selectively removing the second insulating layer, the first conductive layer and the first insulating layer from a non-memory cell area of the surface region until the semiconductor substrate surface is exposed;

selectively removing a portion of the oxidation-resistant layer in the non-memory cell area and a portion of the oxidation-resistant layer in a select transistor; and forming an oxide layer on the surface of the semiconductor substrate area of the semiconductor substrate by thermal oxidation.

7. A method of the claim 5, wherein the oxidation-resistant layer is selected from the group consisting of a silicon nitride layer, an oxy-nitride layer, and a TEOS layer.

8. A method of manufacturing a nonvolatile semiconductor memory device with memory cell sections and peripheral circuit transistor sections having no memory cells formed on a semiconductor substrate comprising the steps of:

forming a first insulating layer, a first conductive layer, and a second insulating layer in sequence on a surface region of the semiconductor substrate;

selectively removing the second insulating layer, the first conductive layer and the first insulating layer on a non-memory cell area until the semiconductor substrate surface is exposed;

forming a third insulating layer on the semiconductor substrate surface in the non-memory cell area;

forming a second conductive layer on the second insulating layer in a memory cell area and on the third insulating layer in the non-memory cell area;

selectively removing the second conductive layer, the second insulating layer, the first conductive layer, and the first insulating layer from a portion of the memory cell area;

selectively removing a portion of each of the second conductive layer and the third insulating layer in the non-memory cell area;

depositing an oxidation-resistant layer on the second conductive layer and the semiconductor substrate;

removing a portion of the oxidation-resistant layer from a portion of the non-memory cell area having a transistor impressed by a voltage of greater than or equal to 8 volts; and forming an oxide layer on the surface of the semiconductor substrate by thermal oxidation.

9. A method of manufacturing a nonvolatile semiconductor memory device according to claim 8, further comprising the steps of:

forming a first oxide layer on the oxidation-resistant layer and the second conductive layer by thermal oxidation;

selectively removing the oxidation-resistant layer; and forming a second oxide layer on the oxidation-resistant layer, the first oxide layer, the second conductive layer and the semiconductor substrate by thermal oxidation.

10. A method of manufacturing a nonvolatile semiconductor memory device according to claim 8, wherein the oxidation-resistant layer is selected from the group consisting of a silicon nitride layer, an oxy-nitride layer, and a TEOS layer.

11. A method of manufacturing a nonvolatile semiconductor memory device formed on a semiconductor substrate, said method comprising the steps of:

forming a first multilayered structure on the semiconductor substrate comprising a plurality of memory cell sections and a second multilayered structure on the semiconductor substrate comprising a plurality of peripheral circuit transistor sections having no memory cells;

coating at least one of the memory cell sections of the first multilayered structure with an oxidation-resistant layer; and forming an oxide layer over an exposed surface above the semiconductor substrate by thermal oxidation.

12. The method of claim 11, further comprising the step of forming the oxidation-resistant layer on top of the second multilayered structure prior to said step of forming the oxide layer.

13. The method of claim 11, wherein said step of coating further includes coating each memory cell section of the first multilayered structure with the oxidation-resistant layer.

14. The method of claim 13, further includes the steps of coating the second multilayered structure with the oxidation-resistant layer simultaneously with said step of coating each memory cell section of the first multilayered structure and removing the oxidation-resistant layer from the second multilayered structure prior to said step of forming the oxide layer.

15. The method of claim 11, wherein said step of coating further includes coating each memory cell section of the first multilayered structure with the oxidation-resistant layer and simultaneously coating the second multilayered structure with the oxidation-resistant layer, and said method includes the further step of removing the oxidation-resistant layer from the second multilayered structure and one of the memory cell sections of the first multilayered structure prior to said step of forming the oxide layer.

16. The method of claim 11, wherein said step of coating further includes coating each memory cell section of the first multilayered structure with the oxidation-resistant layer and simultaneously coating one of the peripheral circuit transistor sections of the second multilayered structure with the oxidation-resistant layer.

17. The method of claim 16, wherein one of the peripheral circuit transistor sections is not coated with the oxidation-resistant layer, the uncoated peripheral circuit transistor section being a high voltage transistor area.

18. The method of claim 16, wherein said step of coating further includes coating each peripheral circuit transistor section of the second multilayered structure with the oxidation-resistant layer, and said method includes the further step of removing the oxidation-resistant layer from one of the peripheral circuit transistor sections of the second multilayered structure prior to said step of forming the oxide layer.

19. The method of claim 16, further including the steps of removing the oxide layer and the oxidation-resistant layer from the one of the peripheral circuit transistor sections of the second multilayered structure, and forming another oxide layer over the surface of the semiconductor substrate by thermal oxidation.

* * * * *